United States Patent
Tsai et al.

(10) Patent No.: US 7,223,527 B2
(45) Date of Patent: May 29, 2007

(54) IMMERSION LITHOGRAPHY PROCESS, AND STRUCTURE USED FOR THE SAME AND PATTERNING PROCESS

(75) Inventors: Kao-Tsair Tsai, Kaohsiung (TW); Jan-Nan Oue, Baoshan Township, Hsinchu County (TW)

(73) Assignee: Winbond Electronics Corp., Hsinchu (TW)

( * ) Notice: Subject to any disclaimer, the term of this patent is extended or adjusted under 35 U.S.C. 154(b) by 141 days.

(21) Appl. No.: 11/112,105

(22) Filed: Apr. 21, 2005

(65) Prior Publication Data

US 2006/0238727 A1    Oct. 26, 2006

(51) Int. Cl.
*G03F 7/11* (2006.01)
*G03F 7/039* (2006.01)
*G03F 7/30* (2006.01)
*G03F 7/207* (2006.01)

(52) U.S. Cl. .................. 430/326; 430/273.1; 430/327

(58) Field of Classification Search ............. 430/273.1, 430/326, 327
See application file for complete search history.

(56) References Cited

U.S. PATENT DOCUMENTS

| 2001/0053486 A1* | 12/2001 | Matsunuma ................ 430/5 |
| 2005/0123863 A1* | 6/2005 | Chang et al. .............. 430/322 |
| 2005/0202347 A1* | 9/2005 | Houlihan et al. .......... 430/311 |
| 2005/0250898 A1* | 11/2005 | Maeda et al. ............. 524/544 |

* cited by examiner

*Primary Examiner*—Richard L. Schilling
(74) *Attorney, Agent, or Firm*—J.C. Patents

(57) ABSTRACT

An immersion lithography process is described. First, a photoresist layer on a material layer is formed. Then, an acid compensation layer is formed on the photoresist layer. An immersion exposure step is performed on the acid compensation layer and the photoresist layer. The acid compensation layer contains a photo-acid generator with a concentration of the photo-acid higher than that produced by a photo-acid generator in the photoresist layer after the immersion exposure step. Then, a development step is performed to pattern the acid compensation layer and the photoresist layer.

8 Claims, 2 Drawing Sheets

IMMERSION LITHOGRAPHY PROCESS, AND STRUCTURE USED FOR THE SAME AND PATTERNING PROCESS

BACKGROUND OF THE INVENTION

1. Field of the Invention

This invention relates to a semiconductor process, and particularly to an immersion lithography process and a patterning process.

2. Brief Description of Related Art

Photolithography is one of the most important technologies in semiconductor production. All patterns or doping areas regarding to metal oxide semiconductor device are defined by photolithography. In general, photolithography process includes photoresist coating, light exposure and development. In the exposure step, exposure light beams travel through a mask to reach a photoresist layer or directly reach the photoresist layer to generate photochemical reaction at exposed sections of the photoresist layer. After baking and developing steps, mask patterns are transferred to the photoresist layer to form a patterned photoresist layer.

As the integration of integral circuits increases, the device size of the integral circuits decreases. In order to meet the requirement in reduction of device size, an immersion lithography process has been developed. Currently, this immersion lithography process is conducted in liquid phase. By taking the advantage that the refractive index of liquid is higher than that of air, the wavelength will be shortened while light travels through liquid. The resolution of exposure is thereby increased to achieve the reduction in device size.

However, the immersion lithography process has several critical concerns to be overcome, such as interaction between the immersion liquid and the photoresist layer and the control of micro-bubbles in the liquid. Specifically when the exposure step is conducted, part of chemicals enters the liquid from the photoresist layer due to the contact with the liquid, which deteriorates the photoresist layer. Particularly, when photo-acid generator (PAG) contained in the photoresist layer diffuses into the immersion liquid during the exposure step, the PAG concentration will be lowered. As a result, the developed photoresist patterns have T-top problem. As such, the process resolution, the process window, and the critical size and uniformity of the photoresist patterns are adversely affected.

One approach has been proposed to solve the T-top problem in the art by forming a barrier layer over the photoresist layer. The barrier layer does not contain photo-acid generator, and is used to stop the photo-acid generator from diffusing into the immersion liquid. The formation of the barrier layer is complicated as the property of the barrier layer must be unsolvable in the immersion liquid during the exposure step while solvable in tetra-methyl-ammonium hydroxide (TMAH) developing agent. Furthermore, forming the barrier layer on the photoresist layer adds cost to the total production.

SUMMARY OF THE INVENTION

Therefore, it is an object of the invention to provide an immersion lithography process that solves the T-top problem in the art caused by the diffusion of chemicals into the immersion liquid from the photoresist layer so as to improve the process resolution.

It is another object of the invention to provide a patterning process that precisely controls the critical size and increases the uniformity of the critical size.

It is another object of the invention to provide a structure used in the immersion lithography process to prevent the formation of T-top photoresist patterns and thus increases the process window.

In one aspect of the invention, an immersion lithography process is provided. The immersion lithography process comprises forming a photoresist layer on a material layer; forming an acid compensation layer on the photoresist layer; performing an immersion exposure step on the acid compensation layer and the photoresist layer; and performing a development step to pattern the acid compensation layer and the photoresist layer.

According to one preferred embodiment of the invention, the acid compensation layer contains a photo-acid generator with a concentration of the photo-acid higher than that produced by a photo-acid generator in the photoresist layer after the immersion exposure step.

According to one preferred embodiment of the invention, the material of the acid compensation layer is the same as that of the photoresist layer, and the acid compensation layer contains a photo-acid generator with a concentration higher than that in the photoresist layer.

According to one preferred embodiment of the invention, the material of the acid compensation layer is different from that of the photoresist layer, and the acid compensation layer contains a photo-acid generator that has a dissolving rate lower than that contained in the photoresist layer.

According to one preferred embodiment of the invention, the acid compensation layer has a thickness of about 10–30 nm.

In another aspect of the invention, a patterning process is provided. The patterning process comprises forming a photoresist layer on a material layer; forming an acid compensation layer on the photoresist layer; performing an immersion exposure step on the acid compensation layer and the photoresist layer; performing a development step to form a patterned acid compensation layer and a patterned photoresist layer; and etching the material layer by using the patterned acid compensation layer and the patterned photoresist layer as etching masks.

According to one preferred embodiment of the invention, the aforementioned acid compensation layer contains a photo-acid generator with a concentration of the photo-acid higher than that produced by a photo-acid generator in the photoresist layer after the immersion exposure step.

According to one preferred embodiment of the invention, the material of the acid compensation layer is the same as that of the photoresist layer, and the acid compensation layer contains a photo-acid generator with a concentration higher than that in the photoresist layer.

According to one preferred embodiment of the invention, the material of the acid compensation layer is different from that of the photoresist layer, and the acid compensation layer contains a photo-acid generator that has a dissolving rate lower than that contained in the photoresist layer.

According to one preferred embodiment of the invention, the acid compensation layer has a thickness of about 10–30 nm.

The present invention further provides a structure used in an immersion lithography process. The structure comprises a photoresist layer on a material layer; and an acid compensation layer on the photoresist layer.

According to one preferred embodiment of the invention, the material of the acid compensation layer is the same as that of the photoresist layer, and the acid compensation layer contains a photo-acid generator with a concentration higher than that in the photoresist layer.

According to one preferred embodiment of the invention, the material of the acid compensation layer is different from that for the photoresist layer, and the acid compensation layer contains a photo-acid generator that has a dissolving rate lower than that contained in the photoresist layer.

According to one preferred embodiment of the invention, the acid compensation layer has a thickness of about 10–30 nm.

In the invention, the acid compensation layer formed over the photoresist layer is used as a photo-acid generator diffusion layer to replace the photoresist layer. After the immersion exposure step, the concentration of the photo-acid generator contained in the acid compensation layer is higher than that in the photoresist layer. There are no T-top concerns in the subsequent processing steps so that the critical size of the patterns can be precisely controlled and thus the process resolution can be improved.

DETAILED DESCRIPTION OF THE PREFERRED EMBODIMENTS

In order to solve the problems caused by diffusion of chemicals from a photoresist layer into a lithography liquid used in an immersion lithography process or even diffusion of the lithography liquid into the photoresist layer, this invention provides an immersion lithography process and a structure and patterning process for the same. In the invention, an acid compensation layer is formed over the photoresist layer to increase the process resolution. The invention will be illustrated by exemplifying some embodiments and should not be used to limit the invention.

Figure 1A:
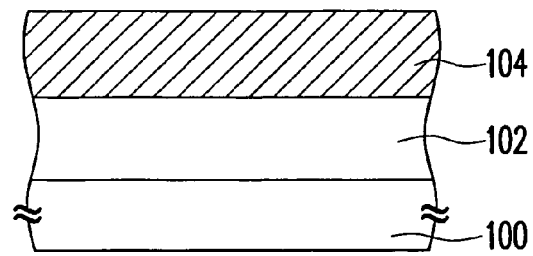
FIG. 1A to FIG. 1E are schematic cross-sectional views showing an immersion lithography according to one preferred embodiment of the invention.

FIG. 1A to FIG. 1D are schematic views illustrating an immersion lithography process according to one preferred embodiment of the invention. Referring to FIG. 1A, a substrate 100 is provided on which a material layer has been formed. The material layer 102 can be, for example, a material layer to be patterned, such as a dielectric layer, a conductive layer or the like. The material layer 102 can also be a material layer to be ion implanted, such as silicon substrate, a dielectric layer, a conductive layer or the like. The material layer 102 is not particularly limited as long as it can be patterned in subsequent steps by using a photoresist layer.

Referring to FIG. 1A, a photoresist layer 104 is formed over the material layer 102. The photoresist layer 104 can be, for example, positive photoresist. The material of the photoresist layer 104 can be any commercially available photosensitive material, such as a mixed photosensitive material with mixture of a polymer, a photo-acid generator (PAG), an acid quencher, an additive and a solvent. The photoresist layer 104 is formed by known photoresist application and hot baking process.

Figure 1B:
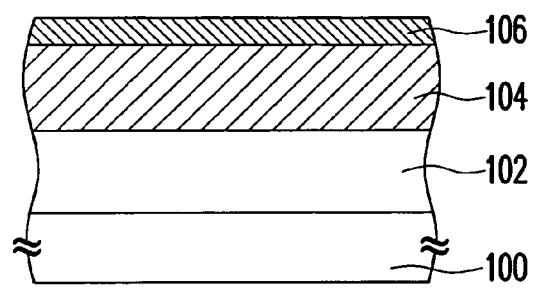

Referring to FIG. 1B, an acid compensation layer 106 is formed over the photoresist layer 104. The acid compensation layer 106 has a thickness of about 10–30 nm. The acid compensation layer 106 can be formed by the aforementioned known photoresist application and hot baking process. In one embodiment of the invention, the material of the acid compensation layer 106 can be the same as that of the photoresist layer 104. The concentration of the photo-acid generator in the acid compensation layer 106 is higher than that in the photoresist layer 104. In another embodiment of the invention, the material of the acid compensation layer 106 can be different from that of the photoresist layer 104 and the dissolving rate for the photo-acid generator in the acid compensation layer 106 is slower than that of photoresist layer 104.

Figure 1C:
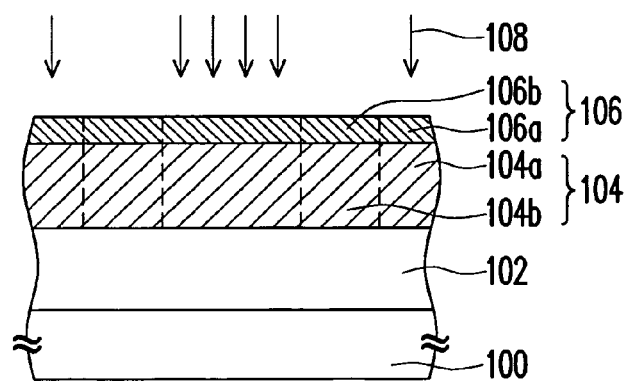

Referring to FIG. 1C, an immersion exposure step 108 is performed on the acid compensation layer 106 and the photoresist layer 104. The immersion exposure step 108 is conducted in an immersion liquid. An exposure light source used in the immersion exposure step 108 can be any of commercially available exposure light source with any light wavelength, such as I ray, KrF laser, ArF laser, F laser or other exposure light sources known in the art. After the immersion exposure step 108 has been processed, exposure light beams travel through transparent area and non-transparent area of a mask (not shown) to form exposed sections 106a and 104a and unexposed sections 106b and 104b on the acid compensation layer 106 and the photoresist layer 104. Photochemical reaction occurs in the exposed sections 106a and 104a due to the exposure to light.

Since the immersion exposure step 108 is conducted in the immersion liquid so that the light beams enter the photoresist layer 104 through the liquid that has refractive index higher than the air, the resolution of the exposure will be increased. However, since the immersion exposure step 108 is processed in the immersion liquid that the photo-acid generator in the acid compensation layer 106 will interact with the immersion liquid. That is, the said photo-acid generator diffuses into the immersion liquid and the immersion liquid may also diffuse into the acid compensation layer 106.

Particularly note that if the material of the acid compensation layer 106 is the same as that of the photoresist layer 104, since the concentration of the photo-acid generator in the acid compensation layer 106 is higher than that in the photoresist layer 104 before the exposure, the concentration of the photo-acid in the acid compensation layer 106 will be higher than that in the photoresist layer 104 after the immersion exposure step 108. In the other case that the material of the acid compensation layer 106 is different from that of the photoresist layer 104, since the dissolving rate of the photo-acid generator of the acid compensation layer 106 is slower than that of the photoresist layer 104, the concentration of the photo-acid in the acid compensation layer 106 will be higher than that in the photoresist layer 104 after the immersion exposure step 108.

Figure 1D:
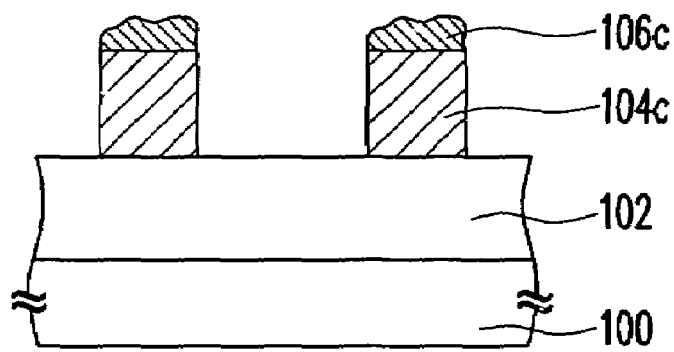

Referring to FIG. 1D, a development step is performed to pattern the acid compensation layer 106 and the photoresist layer 104 to form a patterned acid compensation layer 106c and a patterned photoresist layer 104c on the material layer 102. In one embodiment, a baking step can be further performed after the immersion exposure step 108 and before the development step. In the development step, the exposed acid compensation layer 106 and the exposed photoresist layer 104 are immersed in a developing agent to remove the exposed sections 106a and 104a, leaving the unexposed sections 106b and 104b so as to form the patterned acid compensation layer 106c and the patterned photoresist layer 104c.

In the above embodiment, since the concentration of the photo-acid generator in the acid compensation layer 106 is higher than that of the photoresist layer 104, the concentration of the photo-acid generator in the photoresist layer 104 will not be reduced in the development step. Accordingly, the prior art T-top problems of the photoresist patterns (such as the patterned acid compensation layer 106c and the patterned photoresist layer 104c shown in FIG. 1D) resulted from the reduced concentration of the photo-acid in the photoresist layers will be solved. Therefore, the process resolution, the process window and even the critical size and uniformity of the photoresist pattern will not adversely affected.

The following description illustrates the subsequent patterning process after the development step by using the present invention of the immersion lithography process.

Figure 1E:
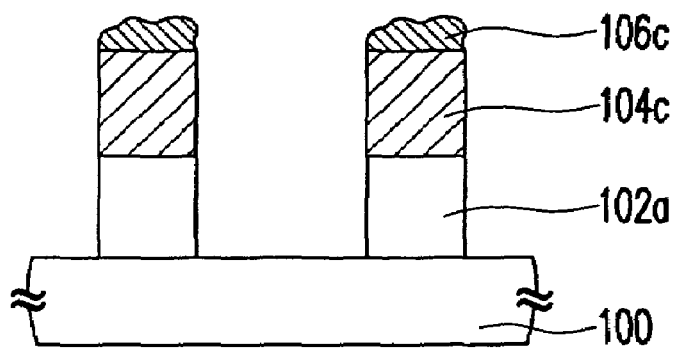

Referring to FIG. 1E, the material layer 102 is etched using the patterned acid compensation layer 106c and the patterned photoresist layer 104c as etching masks to form a material layer 102a. Particularly, after the described development step, the patterned acid compensation layer 106c and the patterned photoresist layer 104c will not have any T-top problem. In addition, the line width of the photoresist pattern is not affected. In other words, the profile and outline of the photoresist patterns formed by the immersion lithography process of the invention is more precise than those in the prior art. Therefore, using the photoresist layer as an etching mask will improve the precision of the critical size of the material layer 102a formed after etching.

The structure used in the immersion lithography process according to the invention includes the photoresist layer 104 and the acid compensation layer 106 as shown in FIG. 1B. The photoresist layer 104 can be located on the material layer 102 to be patterned or on the material layer 102 to be ion implanted, and the acid compensation layer 106 can be disposed on the photoresist layer 104. The acid compensation layer 106 is used as a photo-acid generator diffusion layer to prevent T-top problem occurring in the subsequently formed photoresist patterns.

In view of the forgoing, the immersion lithography process according to the invention has advantages over the prior art as follows.

1. The acid compensation layer formed on the photoresist layer prevents the diffusion of the immersion liquid and the photoresist layer that often causes T-top photoresist patterns in the conventional immersion lithography process. Therefore, the process resolution and the process window can be improved.
2. Since the acid compensation layer and the photoresist layer are made of the same material, the production process is simplified and the cost is reduced.
3. The patterning process of the invention can more precisely control the critical size and thus improve the uniformity of the critical size.
4. The process of the invention can be applied in the currently existing immersion lithography process. In other words, the exposure light source and photoresist material used in the art can be used in the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An immersion lithography process, comprising:
    forming a photoresist layer that contains a first photo-acid generator on a material layer;
    forming an acid compensation layer on the photoresist layer, wherein the material of the acid compensation layer is the same as that of the photoresist layer;
    performing an immersion exposure step on the acid compensation layer and the photoresist layer; and performing a development step to pattern the acid compensation layer and the photoresist layer.

2. The immersion lithography process of claim 1, wherein the acid compensation layer contains a second photo-acid generator with a concentration of the photo-acid higher than that produced by the first a photo-acid generator in the photoresist layer after the immersion exposure step.

3. The immersion lithography process of claim 1, wherein the acid compensation layer contains a second photo-acid generator with a concentration higher than that in the photoresist layer.

4. The immersion lithography process of claim 1, wherein the acid compensation layer has a thickness of 10–30 nm.

5. A patterning process, comprising:
    forming a photoresist layer that contains a first photo-acid generator on a material layer;
    forming an acid compensation layer on the photoresist layer, wherein the material of the acid compensation layer is the same as that of the photoresist layer;
    performing an immersion exposure step on the acid compensation layer and the photoresist layer;
    performing a development step to form a patterned acid compensation layer and a patterned photoresist layer; and
    etching the material layer by using the patterned acid compensation layer and the patterned photoresist layer as etching masks.

6. The patterning process of claim 5, wherein the acid compensation layer contains a second photo-acid generator with a concentration of the photo-acid higher than that produced by the first a photo-acid generator in the photoresist layer after the immersion exposure step.

7. The patterning process of claim 5, wherein the acid compensation layer contains a second photo-acid generator with a concentration higher than that in the photoresist layer.

8. The patterning process of claim 5, wherein the acid compensation layer has a thickness of 10–30 nm.

* * * * *